(12) United States Patent
Kingston et al.

(10) Patent No.: US 10,277,247 B1
(45) Date of Patent: Apr. 30, 2019

(54) STATEFUL COMPRESSION SCHEME FOR EFFICIENT PACKING OF KINEMATIC DATA

(71) Applicant: BAE SYSTEMS Information and Electronic Systems Integration Inc., Nashua, NH (US)

(72) Inventors: Peter M. Kingston, Somerville, MA (US); Lingji Chen, Acton, MA (US); Eric N. Duchon, Arlington, MA (US); Christopher D. Moss, Cambridge, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/950,913

(22) Filed: Apr. 11, 2018

(51) Int. Cl.
*H03M 7/30* (2006.01)
*H03M 7/40* (2006.01)

(52) U.S. Cl.
CPC ....... *H03M 7/4018* (2013.01); *H03M 7/3071* (2013.01); *H03M 7/6035* (2013.01)

(58) Field of Classification Search
CPC . H03M 7/4018; H03M 7/3071; H03M 7/6035
USPC ........................................................ 341/107
See application file for complete search history.

(56) References Cited

U.S. PATENT DOCUMENTS

| | | | | |
|---|---|---|---|---|
| 6,317,520 B1 * | 11/2001 | Passaggio | ........... | H03M 7/3059 382/238 |
| 7,949,862 B2 * | 5/2011 | Yokoi | ...................... | G06F 9/322 712/238 |
| 8,294,953 B2 * | 10/2012 | Shaw | ...................... | H04N 1/644 358/3.23 |

* cited by examiner

*Primary Examiner* — Brian K Young
(74) *Attorney, Agent, or Firm* — Finch & Maloney PLLC

(57) ABSTRACT

A receiver includes: a filter circuit to generate predicted measurements for a set of tracks based on previous kinematic states of the tracks and timing and source data of next compressed measurements associated to the tracks, generate probability data of differences between the predicted measurements and next measurement data, generate the next measurement data using the predicted measurements and quantized differences between the predicted measurements and the next measurement data, and generate next kinematic states of the tracks based on the previous kinematic states, the timing and source data of the next compressed measurements, and the generated measurement data; a quantizer circuit to quantize the probability data into quantization tables and look up the quantized differences from corresponding indices in the quantization tables; and a decoder circuit to decode encoded index data of the next compressed measurements into the corresponding indices in the quantization tables using the quantized probability data.

20 Claims, 5 Drawing Sheets

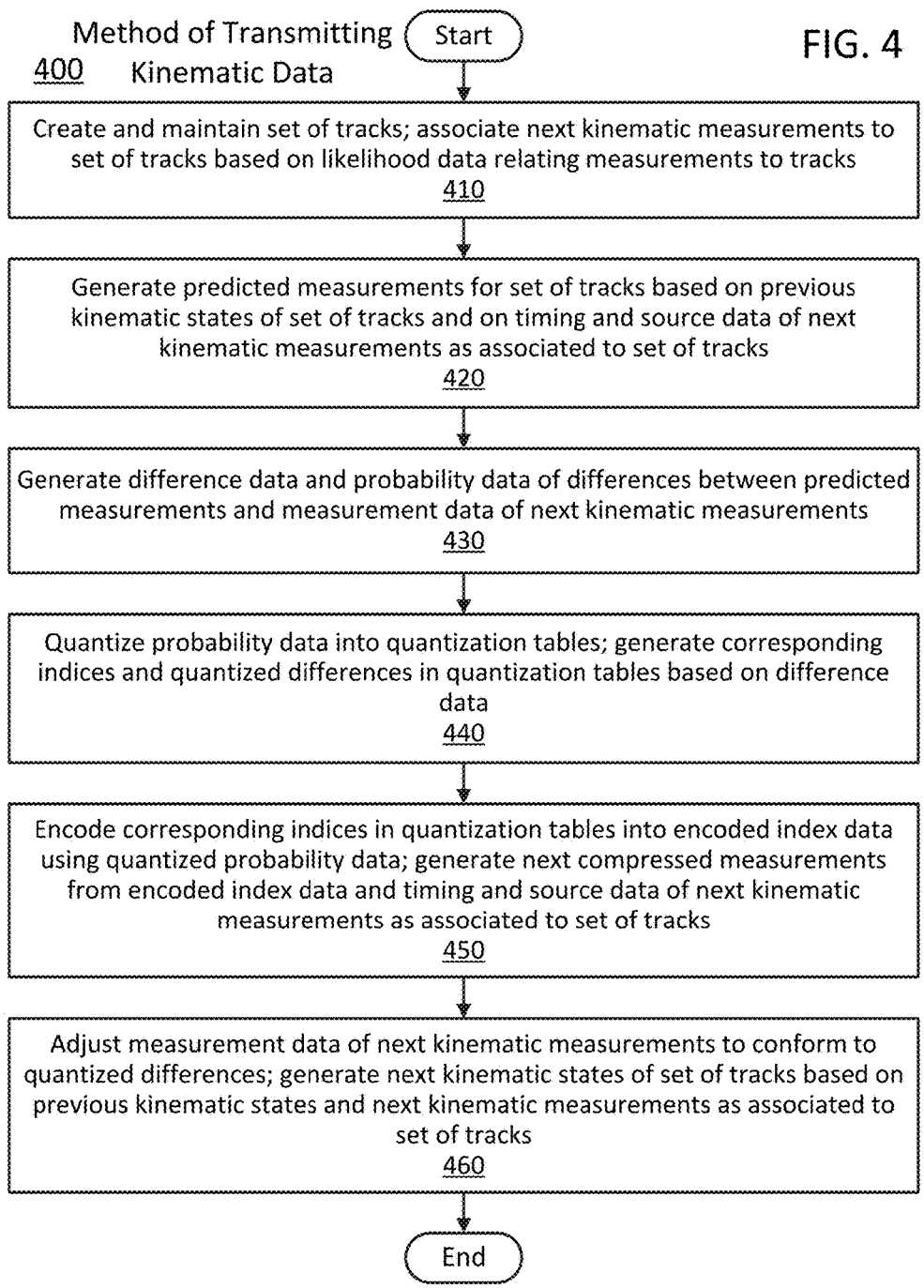

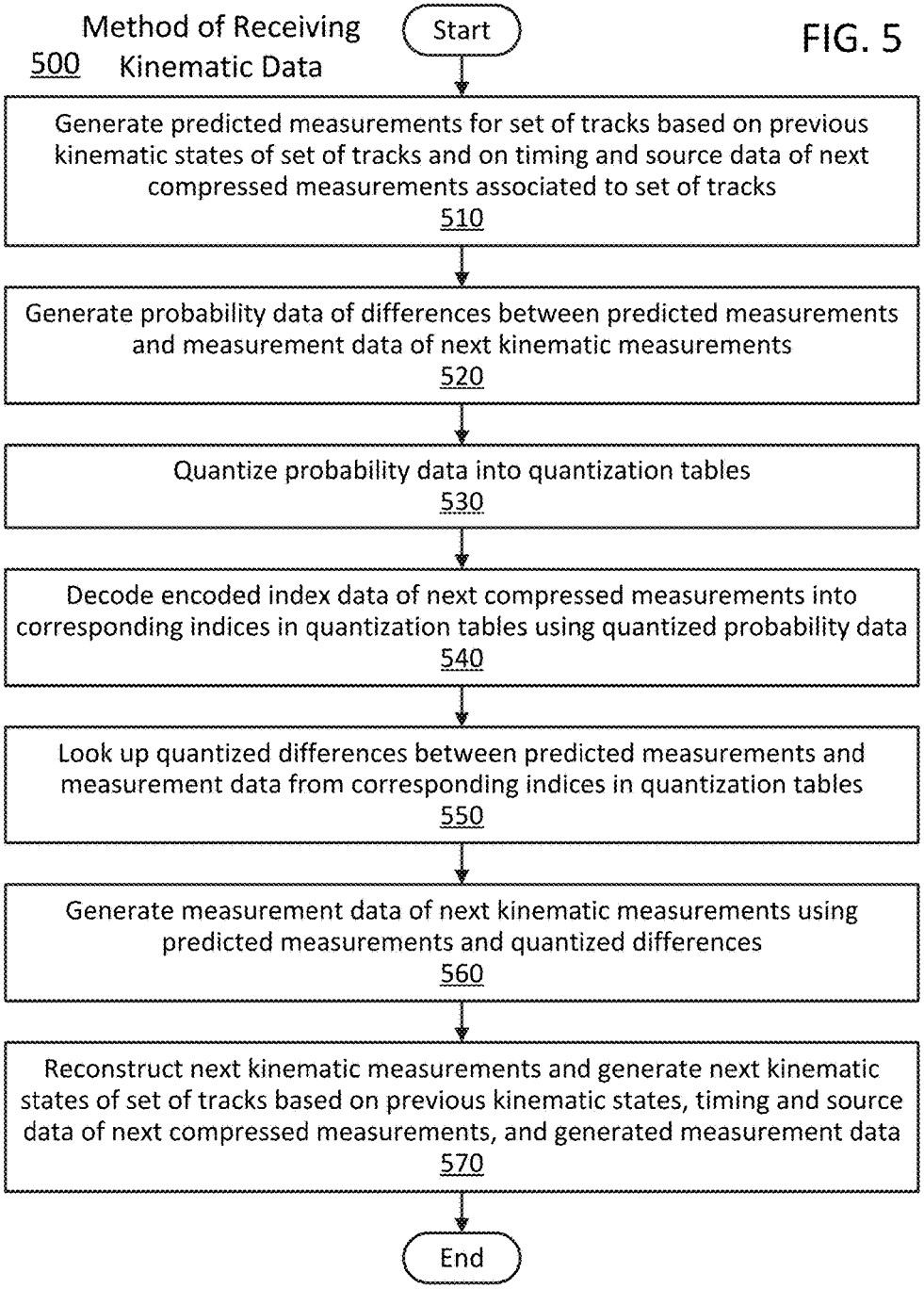

STATEFUL COMPRESSION SCHEME FOR EFFICIENT PACKING OF KINEMATIC DATA

STATEMENT REGARDING FEDERALLY SPONSORED RESEARCH OR DEVELOPMENT

This invention was made with government support under contract FA8750-16-C-0002 awarded by the U.S. Air Force. The government has certain rights in the invention.

FIELD OF THE DISCLOSURE

This disclosure relates to a stateful compression scheme for efficient packing of kinematic data.

BACKGROUND

Some communication channels, such as tactical data links, can have a low bandwidth. Kinematic (or motion) data, such as that generated by sensors including cameras and radar tracking moving objects, however, can be large in size and have a high update rate. Accordingly, there can be insufficient throughput in data links to maintain a consistent situational awareness across different platforms. Compressing the kinematic data prior to sending it can increase the effective bandwidth of the data link, but there are a number of non-trivial issues associated with such compression.

BRIEF DESCRIPTION OF THE DRAWINGS

Features of embodiments of the claimed subject matter will become apparent as the following Detailed Description proceeds, and upon reference to the Drawings, wherein like numerals depict like parts.

FIG. 4 is a flow diagram of an example method of transmitting kinematic data, according to an embodiment of the present disclosure.

FIG. 5 is a flow diagram of an example method of receiving kinematic data transmitted using the method of FIG. 4, according to an embodiment of the present disclosure.

Figure 1:
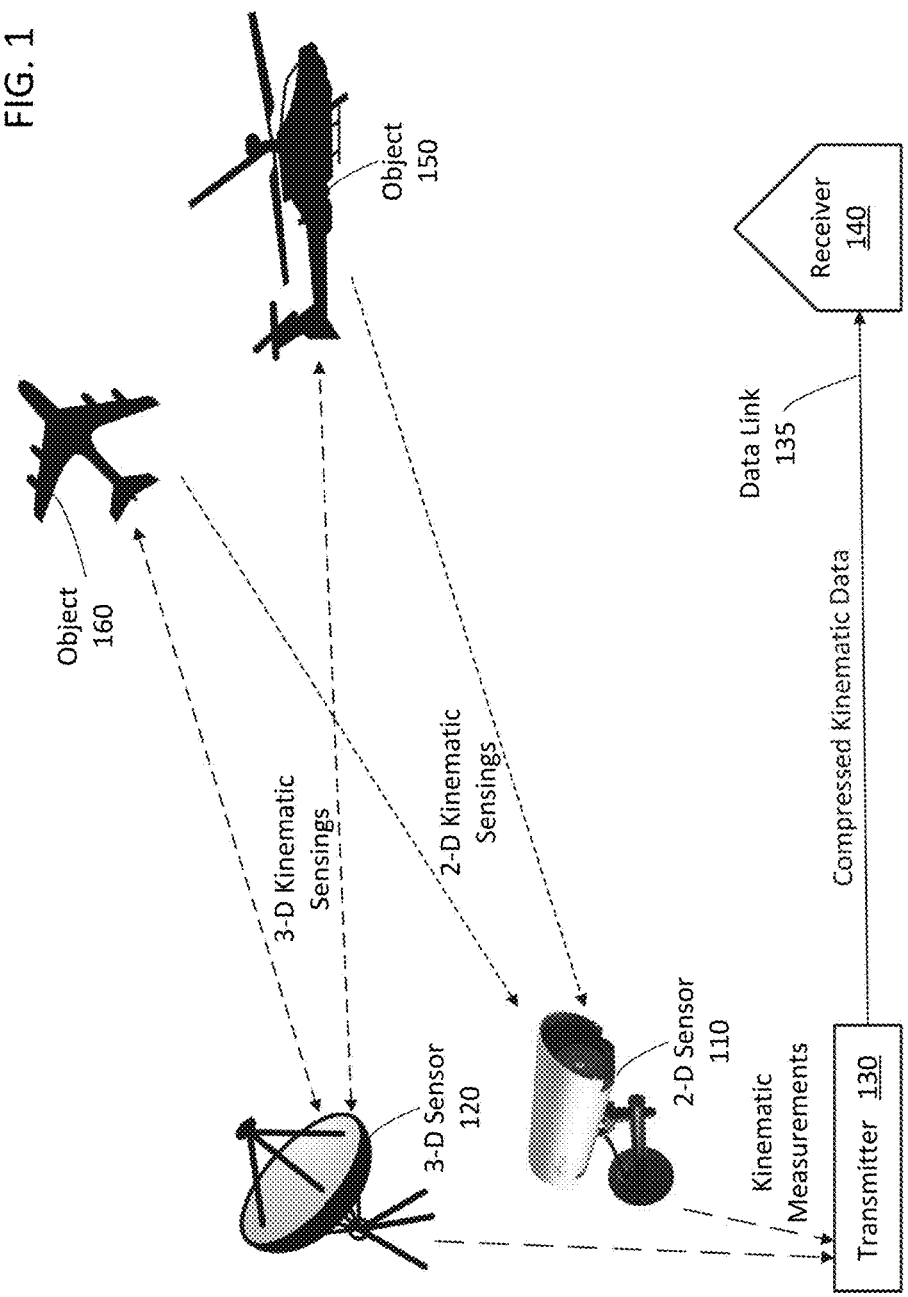
FIG. 1 is a. schematic diagram of an example use case for a communication system configured for generating and transferring compressed kinematic data, according to an embodiment of the present disclosure.

Although the following Detailed Description will proceed with reference being made to illustrative embodiments, many alternatives, modifications, and variations thereof will be apparent to those in light of the present disclosure.

DETAILED DESCRIPTION

According to one or more embodiments of the present disclosure, predictive coding is used to encode kinematic data such as from two-dimensional (2-D) sensors and three-dimensional (3-D) sensors by encoding only the (statistical) difference between data already received and the new incoming data. For example, instead of encoding full geodetic coordinates for each new measurement, in some embodiments, predictive coding is used to encode only those bits that cannot be predicted given the previous measurements. For another example, instead of trying to maintain full precision of the measured data, in some embodiments, lossy compression is used to maintain only those bits that statistically are likely to provide the needed or sufficient resolution for the users of the kinematic data. In one or more embodiments, mutual (e.g., redundant) information is exploited to improve the compression ratio or packing efficiency of kinematic data. For example, with kinematic data of moving objects, redundancy is introduced between measurement times (due to the predictability of moving objects) and between measurement sources (e.g., when an object changes motion from one sensor's perspective, it usually causes a corresponding change in motion from another sensor's perspective). Exploiting this redundancy can result in significant improvements in the compression ratio of such data.

General Overview

As mentioned above, there are a number of non-trivial issues associated with the compression of kinematic data. There can be a large amount of kinematic data generated by numerous sensors across a constellation of platforms. While standard compression techniques can reduce the amount of data somewhat (perhaps between two and ten times, depending on the type of data), kinematic data captures objects in motion, so the data from one measurement to the next is constantly changing with the objects' motion, which frustrates standard compression techniques. In addition, this phenomenon with standard compression techniques compounds itself with the number of objects being tracked by the kinematic data, since multiple moving objects further increases the diversity and inconsistency of the collected data from one measurement to the next. Furthermore, alternatives to compression such as downsampling can create unacceptably low correlation from one measurement to the next, rendering the kinematic data unfit for tasks such as accurately tracking moving objects.

Thus, and in accordance with various embodiments, predictive coding exploits the relative non-randomness of object motion over time to compress the kinematic data by over 100 times (such as 200 times as small), significantly outperforming other techniques by over ten times the compression ratio. This is useful in environments for tracking numerous objects with different sensors and limited data bandwidth between the collecting station (where sensors transmit their data) and the receiving station (where the data is ultimately stored and processed). It is also useful for freeing up data link bandwidth for other areas, such as sampling rate, error correction coding, track update rate, precision of a single update, number of tracks, number of platforms sharing the data link or channel, and other telecommunications, to name a few.

In various embodiments, the predictive coding is used to compress kinematic data (such as for multi-target tracking) obtained from different types of sensors, such as radar, electro-optical (EO) or infra-red (IR) sensors such as cameras, passive radio frequency (RF) sensors, and Global Positioning System (GPS) sensors, to name a few. In other various embodiments, the predictive coding is used to compress other kinematic data for which a physical or other statistical model exists to generate sequences (or tracks) of data points from one kinematic measurement to another. Numerous other example embodiments and configurations will be apparent in light of this disclosure.

For example, in one embodiment, a transmitter is provided. The transmitter includes a filter circuit (such as a Kalman filter), a quantizer circuit, and an encoder circuit (such as an entropy encoder). The filter circuit is configured to generate predicted measurements for a set of tracks, such as hypothesized paths generated in the process of tracking moving objects (or tracked objects). With tracking, each tracked object ideally corresponds to one track. However, given the real-time nature of tracking and the diversity of measurement timings and sources whose data is used to generate the tracks, deviations from this ideal behavior can occur, such as the same tracked object may sometimes be represented in multiple tracks, multiple tracked objects may sometimes be represented by the same track, and tracks may sometimes not even correspond to objects intended to be tracked. Since the distinction is not relevant to the techniques described herein, the terms "track" and "tracked object" may be used somewhat synonymously throughout. That said, the filter circuit generates the predicted measurements for the set of tracks (or tracked objects) based on previous kinematic states of the set of tracked objects or tracks and on timing and source data of next kinematic measurements as associated to the set of tracked objects or tracks (such as by an associator).

The filter circuit is further configured to generate probability data (such as probability distribution data) of differences between the predicted measurements and measurement data of the next kinematic measurements, generate difference data between the predicted measurements and the measurement data of the next kinematic measurements, and generate next kinematic states of the set of tracked objects or tracks based on the previous kinematic states and the next kinematic measurements as associated to the set of tracked objects or tracks (for example, by a weighted average). The quantizer circuit is configured to quantize the probability data into quantization tables (e.g., convert continuous probability distribution data into quantized or discrete differences of predicted versus actual measurements along with their corresponding probabilities) and generate corresponding indices in the quantization tables based on the difference data. The encoder circuit is configured to encode the indices in the quantization tables into encoded index data using the quantized probability data (e.g., by entropy coding), and generate next compressed measurements from the encoded index data and the timing and source data of the next kinematic measurements as associated to the set of tracked objects or tracks. Numerous other transmitter configurations will be apparent.

In another embodiment, a receiver is provided. The receiver includes a filter circuit (such as a Kalman filter), a quantizer circuit, and a decoder circuit (such as an entropy decoder). The filter circuit is configured to generate predicted measurements for a set of tracked objects or tracks based on previous kinematic states of the set of tracked objects or tracks and on timing and source data of next compressed measurements associated to the set of tracked objects or tracks, generate probability data of differences between the predicted measurements and measurement data of next kinematic measurements, generate the measurement data of the next kinematic measurements using the predicted measurements and quantized differences between the predicted measurements and the measurement data, and generate next kinematic states of the set of tracked objects or tracks based on the previous kinematic states, the timing and source data of the next compressed measurements, and the generated measurement data. The quantizer circuit is configured to quantize the probability data into quantization tables and look up the quantized differences from corresponding indices in the quantization tables. The decoder circuit is configured to decode encoded index data of the next compressed measurements into the corresponding indices in the quantization tables using the quantized probability data. Numerous other receiver configurations will be apparent.

In still another embodiment, a method of receiving kinematic data is provided. The method includes: generating predicted measurements for a set of tracked objects or tracks based on previous kinematic states of the set of tracked objects or tracks and on timing and source data of next compressed measurements associated to the set of tracked objects or tracks; generating probability data of differences between the predicted measurements and measurement data of next kinematic measurements; quantizing the probability data into quantization tables; decoding encoded index data of the next compressed measurements into corresponding indices in the quantization tables using the quantized probability data; looking up quantized differences between the predicted measurements and the measurement data from the corresponding indices in the quantization tables; generating the measurement data of the next kinematic measurements using the predicted measurements and the quantized differences; and generating next kinematic states of the set of tracked objects or tracks based on the previous kinematic states, the timing and source data of the next compressed measurements, and the generated measurement data. Numerous other methods (such as methods of transmitting kinematic data) will be apparent.

System Architecture

FIG. 1 is a. schematic diagram of an example use case for a communication system configured for generating and transferring compressed kinematic data, according to an embodiment of the present disclosure.

In FIG. 1, there are a number of moving objects (such as helicopter 150 and airplane 160) being tracked by a number of sensors, such as radar (or 3-D sensor) 120 and camera (or 2-D sensor) 110. The sensors take periodic sensings of their surroundings (also referred to as the environment or scene), depending on various factors such as the type of sensor, the bandwidth available to store or transmit the sensor data, and the like. The sensors (sources) acquire kinematic measurement data (such as 2-D or 3-D location data, velocity data, direction data, and error data, to name a few, depending on the sensor) at periodic intervals (timings). The sensors acquire this data for one or more of the objects in their field of view. The sensors send these measurements to a transmitter 130 (such as a local data collector) for transmission to a receiver 140 (such as a command center or information center) over a data link 135 (such as a wired or wireless communication channel) for further processing.

The data link 135 between the transmitter 130 and the receiver 140 can be a limited resource (e.g., bandwidth constrained), so compressing the measurement data from the sensors to the receiver 140 can be of great benefit to this or other users of the data link 135. Accordingly, in one or more embodiments of the present disclosure, the kinematic measurement data acquired by the sensors is compressed through a predictive coding technique to reduce or minimize its size when transferred over the data link. In some embodiments, the moving objects are tracked through a multi-sensor fusion approach, and those observed tracks are used to predict the next sensor measurements, and hence, the next location(s) of the object(s) being tracked.

For instance, two types of predictions can take place: one for the expected movement of the object (e.g., most likely location at the time of the next sensor measurement), the other for the (continuous) probability distribution of its possible movements (assuming a statistical model is available to account for the object's possible movements). In one or more embodiments, the first type of prediction (expected movement) is used as a baseline, while the second type of prediction (probability distribution of possible movements) can be defined as offsets (differences) from the baseline. In some such embodiments, the differences (and their probability) distributions are quantized to a finite number of possible movements and corresponding discrete probabilities to produce quantization tables. In one or more such embodiments, entropy coding can be applied to the quantization tables to encode their indices in a manner that reduces or minimizes the expected number of bits to express their indices based on the probabilities of the corresponding entries. These and other concepts will be described in further detail with reference to FIGS. 2-5.

Figure 2:
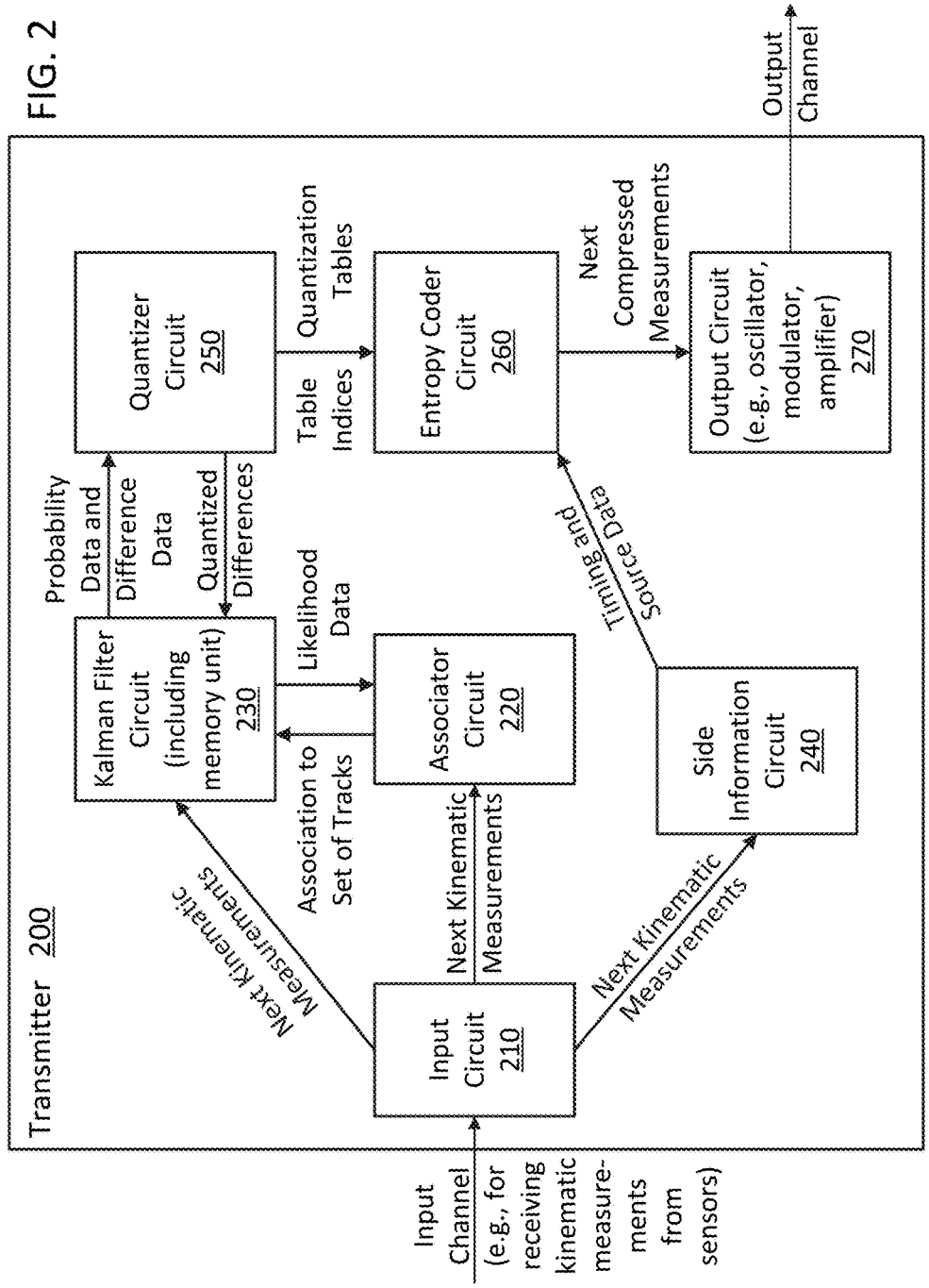
FIG. 2 is a block diagram of an example transmitter for generating and sending compressed kinematic measurements, according to an embodiment of the present disclosure.

FIG. 2 is a block diagram of an example transmitter 200 for generating and sending compressed kinematic measurements, according to an embodiment of the present disclosure. The transmitter 200 and other electronic components and techniques described herein can be implemented as (or on) an electronic processing component, such as a computer, a field programmable gate array (FPGA), a microprocessor, or the like. For example, the transmitter 200 and other components or methods can be implemented in hardware or software, or some combination of the two. For instance, the transmitter 200 can be implemented as a microprocessor with instructions encoded therein that, when executed, cause the microprocessor to carry out the tasks of the transmitter 200. In another embodiment, the transmitter 200 may be implemented as a custom circuit such as a field programmable gate array (FPGA) configured to carry out these tasks. In a further example, there are one or more memory units (such as non-volatile memory units) that is or are coupled to the processing component.

For example, the transmitter 200 and other circuits disclosed herein may be custom hardware circuits or general-purpose computer hardware configured (e.g., through software, firmware, customized logic, to name a few) to carry out the tasks assigned to the circuit. While circuits are illustrated as being made up of other circuits by function, in other embodiments, two or more circuits may be combined into a single circuit performing the functionality of the two or more circuits. In still other embodiments, a single circuit can be divided into two or more circuits, each performing separate functions performed by the single circuit. As will be further appreciated, a circuit as used herein is a physical structure capable of carrying out one or more functionalities as variously provided herein, whether the structure be hardware only such as purpose-built semiconductor (e.g., gate-level logic or application specific integrated circuit) or a printed circuit board populated with discrete components configured and arranged to carry out the various functionalities provided herein, or a processor-based system programmed with computer code or instructions that are executable by the processor-based system to carry out the various functionalities provided herein, or a combination of such hardware and software based architectures (e.g., printed circuit board with one or more embedded routines executable by one or more processors). Numerous such embodiments and configurations will be appreciated in light of this disclosure.

Continuing with FIG. 2, an input channel (such as a wired or wireless data link or links) supplies measurement data to an input circuit 210. The measurement data may be kinematic sensor readings from one or more sensors or sources. Each reading can be referred to as a report or measurement having corresponding timing data (e.g., actual or relative to a baseline, such as a previous such measurement), source data (e.g., sensor identification and other information to describe the perspective and type of sensor information returned by the sensor), measurement data (e.g., location such as range-bearing-elevation (RBE), Cartesian (XYZ), planar (XY), azimuth or bearing-elevation (BE), or the like), and other data (depending on the sensor, such as velocity, direction, error or probability data to express a confidence or likelihood of the accuracy of the measurement data, to name a few).

The timing and source data can be reduced to that needed to recreate the timing and source data, such as an offset for the timing (from the last measurement from that source) and an index for the source (into a table of possible sources observing the environment or scene in which moving objects are being tracked). The other data (such as velocity or error data) can be combined with the measurement data (e.g., treated like measurement data, as another dimensional component) in the data fusion technique to, for example, better define the overall kinematic state of the corresponding object being tracked, or better weight the contribution of the particular measurement with the kinematic state, or the like.

These input measurements can be restricted to a particular object being tracked. For instance, in some embodiments, when a sensor generates data including locations of several objects, a separate report or measurement is provided for each such object that can be identified from the original sensor data. In some embodiments, the output of the input circuit 210 is a set of next kinematic measurements, each measurement having timing, source, and measurement (including other) data for a particular object.

As part of the compression process that takes place in the transmitter 200, the kinematic measurements are assigned to tracks (e.g., paths in 3-D space through which objects being tracked move) for use with data fusion or similar techniques. The tracks are maintained by a filter circuit 230 (such as a Kalman filter or a linear-quadratic estimator (LQE), with one Kalman filter or LQE per track). These tracks permit future such measurements to be predicted.

When a new kinematic measurement is received, the filter circuit 230 compares it to the existing tracks, and generates a likelihood for each track that the new measurement is part of the same track. To do this, in one or more embodiments, the filter circuit 230 includes a memory unit and maintains a previous kinematic state of each track (e.g., previous in a sense that it only reflects up until the last measurement associated to that track, however long that may be). The kinematic state information includes kinematic data such as location, velocity, acceleration, direction, together with probability information (e.g., mean vector and covariance matrix, such as for a normal or Gaussian distribution) to describe the likelihood that the kinematic data is accurate and the degree of inaccuracy in the kinematic given the previous measurements used to produce the data.

As such, when a new measurement is received, each track (as performed by the filter circuit 230, or more precisely, in some embodiments, by the Kalman filter maintaining the kinematic state of that track) can estimate the likelihood, given the previous kinematic state for the track together with the timing and source data of the new measurement, that the new measurement belongs to that track. The likelihood might be a percentage, for example, between 0 and 100 percent. The likelihood data for each track is passed to an associator circuit 220.

The associator circuit 220 (such as a 1-step associator) is responsible for creating and maintaining the set of tracks (e.g., the objects being tracked), but not the kinematic states of the tracks (which is handled by the filter circuit 230). To this end, the associator circuit 220 receives each new measurement together with a likelihood (e.g., a percentage) from each track that the new measurement belongs to that track. From this, the associator 220 takes an action, such as assigns the new measurement to an existing track, starts a new track, discards the measurement, hangs onto the measurement for possible future use (but takes no further action), or other appropriate processing. The associator circuit 220 can take additional actions separately from the new measurements, such as deleting tracks that are getting no further measurements, merging tracks that appear to be the same object but whose measurements are split between two or more tracks, splitting tracks whose measurements appear now to represent multiple objects but at one time appeared to only represent a single object, or other such actions.

Once assigned to a track by the associator circuit 220, the new measurement can be processed by the filter circuit 230 (for example, by the corresponding Kalman filter for that track). The filter circuit 230 generates predicted measurement data for the measurement. In one or more embodiments, the filter circuit takes the previous kinematic state for the track, and predicts where the track should be at the timing of the new measurement, and where the sensor (measurement source) should observe the object at that time. This prediction forms a baseline. If the track data is accurate, and the object is moving consistently, the measurement data for the new measurement should be fairly close to this prediction.

However, normal deviations from the predicted measurement data may be inherent in the measurement (e.g., the type of sensor may produce somewhat inaccurate snapshots of an object's movement but that average out over time to nearly the precise path the object traverses). Accordingly, as part of the predicted measurement data process, the filter circuit 230 also produces probability information (such as a mean vector and covariance matrix) representing the possible differences between the baseline (prediction) and the actual measurement. This distribution is continuous (like a probability density function). Accordingly, no one fixed kinematic state has any likelihood of occurring, but regions of the state space have an accumulated likelihood that can be assigned a probability.

Accordingly, in one or more embodiments, a quantizer circuit 250 quantizes or discretizes this continuous probability distribution into a number of regions (e.g., contiguous regions) together with a representative state (e.g., average predicted difference within the region) and corresponding probability for each region. While this introduces some loss of precision or accuracy to the prediction, the loss may be incidental for the application or can be reduced by quantizing into more regions. In some embodiments, the filter circuit 230 sends the probability distribution functions (such as with mean vectors and covariance matrices) for the predicted differences for the new measurement to the quantizer circuit 250, and the quantizer circuit 250 creates a corresponding quantization table of the quantized differences and their associated probabilities.

Further, in some embodiments, the filter circuit 230 provides the quantizer circuit 250 with the actual difference data. For example, the measurement data for the new measurement can be compared to the predicted measurement data, and the difference data between the two sent to the quantizer circuit 250. This difference data is mapped to the quantization table (e.g., to the particular region in the continuous distribution that was quantized as a single entry in the quantization table) to produce a corresponding index in the quantization table representing that difference data. The entry in the quantization table associated with that index has a representative difference (quantized difference) and a corresponding probability.

The quantization table (or, in some embodiments, just the probabilities from the table) is sent to a coder circuit 260, such as an entropy coder (e.g., Huffman coder, arithmetic coder, or the like). The entropy coder circuit 260 takes the quantization table and assigns an encoded index to each entry based primarily on the probability of that entry. In some embodiments, the entropy coder circuit 260 directly assigns the encoded index by considering none, some, or all of the other entries or probabilities in the quantization table. In a general sense, the more likely the entry, the fewer the number of other entries have to be considered by the entropy coder to encode the index. In some embodiments, the entropy coder circuit 260 assigns some of the encoded indices, but stops once it has assigned the desired encoded index. The encoded indices, for example, are variable-length codes with unique prefixes, with the length of the code somewhat inversely proportional to the probability of the corresponding entry (e.g., common entries have relatively short encoded indices, while uncommon entries have relatively long encoded indices). As such, likely values for the difference data (e.g., small differences close to the predicted measurement data) have relatively short encoded indices while unlikely values for the difference data (e.g., large differences far away from the predicted measurement data) have relatively long encoded indices.

Coinciding with these calculations leading up to the encoded index determination, a side information circuit 240 extracts the timing and source data from the next kinematic measurement, and forwards the extracted timing and source data to the entropy coder circuit 260 for inclusion with the encoded index in the next compressed measurement. The compressed measurement is associated with this track (e.g., with a separate track ID field, or grouped together with other measurements from the same track, or similar technique) as part of the compressed output. This is because recreating the association of the new measurements to the tracks may not be practical in the receiver without access to the original measurement data. Accordingly identifying (in some manner) the compressed measurement as belonging to a particular track provides the track association directly to the receiver. The next compressed measurement is passed to an output circuit 270, for transmission to a consumer of the compressed measurements over an output channel (such as a wired or wireless data link to one or more corresponding receiver or receivers). For example, in some embodiments, the output circuit 270 is a radio transmission circuit including, e.g., an oscillator to generate (or help generate) a carrier wave, a modulator to modulate the carrier wave to include the next compressed measurements, and an amplifier to increase the power of the modulated carrier wave for transmission.

While this completes the generation of the next compressed measurement, in some embodiments, the quantizer circuit 250 and filter circuit 230 incorporate the new measurement into the previous kinematic state of the track (to generate the next kinematic state of the track). In some embodiments, the incorporation of new measurements into the previous kinematic state of the corresponding track takes place at particular intervals or time periods, or after so many new measurements for the track have been received, or other similar moment. As part of the incorporation, the quantizer circuit 250 sends back (to the filter circuit 230) the quantized difference corresponding to the actual measurement data difference from the predicted measurement data.

When the filter circuit 230 receives this quantized difference, it adjusts the new measurement data to conform to the quantized difference. In some embodiments, this adjustment is accomplished by adjusting the received measurement data to that which would produce the exact difference data (from the predicted measurement data) in the quantized difference. This can be thought of as generating an approximate or delta-quantized measurement (e.g., something close to the original measurement). In a sense, the new measurement data (or approximate measurement data) is quantized (or delta quantized), in that each new measurement is made to conform to one of those values whose differences with the predicted measurement data produce a corresponding one of the quantized differences. This step introduces error in the measurement data when it is compressed (e.g., lossy compression), but such error may be acceptable to the end user or can be lessened by quantizing into more distinct differences.

By conforming the new measurement data to the corresponding quantized differences, the receiver or other end user or consumer of the compressed measurements can generate the same kinematic states of the tracks, the same predictions of the next measurement data, and decode the corresponding encoded indices as intended. Meanwhile, the adjusted measurement data is likely to produce a slightly inaccurate track with more uncertainty in the corresponding probabilities, but this deviation will likely correct itself over time with future measurement data that will cause the track to stay close to the actual path of the object. For example, the approximate measurements will likely produce a slight jumpiness in the tracked path, similar to other effects of quantization, but this jumpiness can be controlled by the degree of quantization.

Using the adjusted new measurement data, the filter circuit 230 updates the previous kinematic state of the track to the next kinematic state by incorporating the (adjusted) new measurement (or approximate measurement). For example, the filter circuit 230 can use a Kalman filter, which incorporates the new measurement data as part of maintaining the track (e.g., updating the kinematic state such as mean vector and covariance matrix accordingly).

It should be noted that, in some embodiments, pseudomeasurements can be used in place of real measurements. Pseudomeasurements refer to artificial measurement values that are computed to have the same effect on a particular filter (such as a Kalman filter) as one or more real measurements. Pseudomeasurements can be used in a variety of situations. For example, in some embodiments, pseudomeasurements are used to undo a previous filter (such as a previous Kalman filter), to avoid effects such as double filtering. For example, pseudomeasurements can be computed and used as input to a next filter (such as a next Kalman filter) in place of the output of the previous filter. In this manner, the previous filter can be removed and the newly computed pseudomeasurements used instead. As such, the pseudomeasurements are values that would have produced the observed output of the previous filter. The pseudomeasurements can then be used as if they were real measurements, such as by inputting them (possibly together with other real measurements or pseudomeasurements) into the next filter.

For another example, in other embodiments, it may be desired to summarize a number of real measurements by a single equivalent measurement (i.e., a pseudomeasurement) that would have produced the same effect in a next filter (such as a next Kalman filter). For example, 100 position-only measurements taken over the previous few seconds, each of low accuracy, may, collectively, be equivalent to a single high-accuracy (position, velocity) measurement taken at the current instant. Therefore, the 100 low-accuracy measurements can be summarized by computing the single high-accuracy measurement (i.e., the pseudomeasurement). Note that in both the filter-undoing and measurement-summarizing situations just discussed, the computed pseudomeasurements would have produced the observed change in the next filter as if the real measurements had been used instead.

In one or more embodiments, filter-undoing pseudomeasurements are computed to compress data from trackers (as opposed to, for example, from 2D or 3D sensors) that may be used as input to the filter circuit 230. In one or more other embodiments, measurement-summarizing pseudomeasurements are generated from real measurements and sent less frequently than the real measurements. For example, the pseudomeasurements can be sent together with just enough timing data to approximately reconstruct the real measurements at whatever times they occurred.

Figure 3:
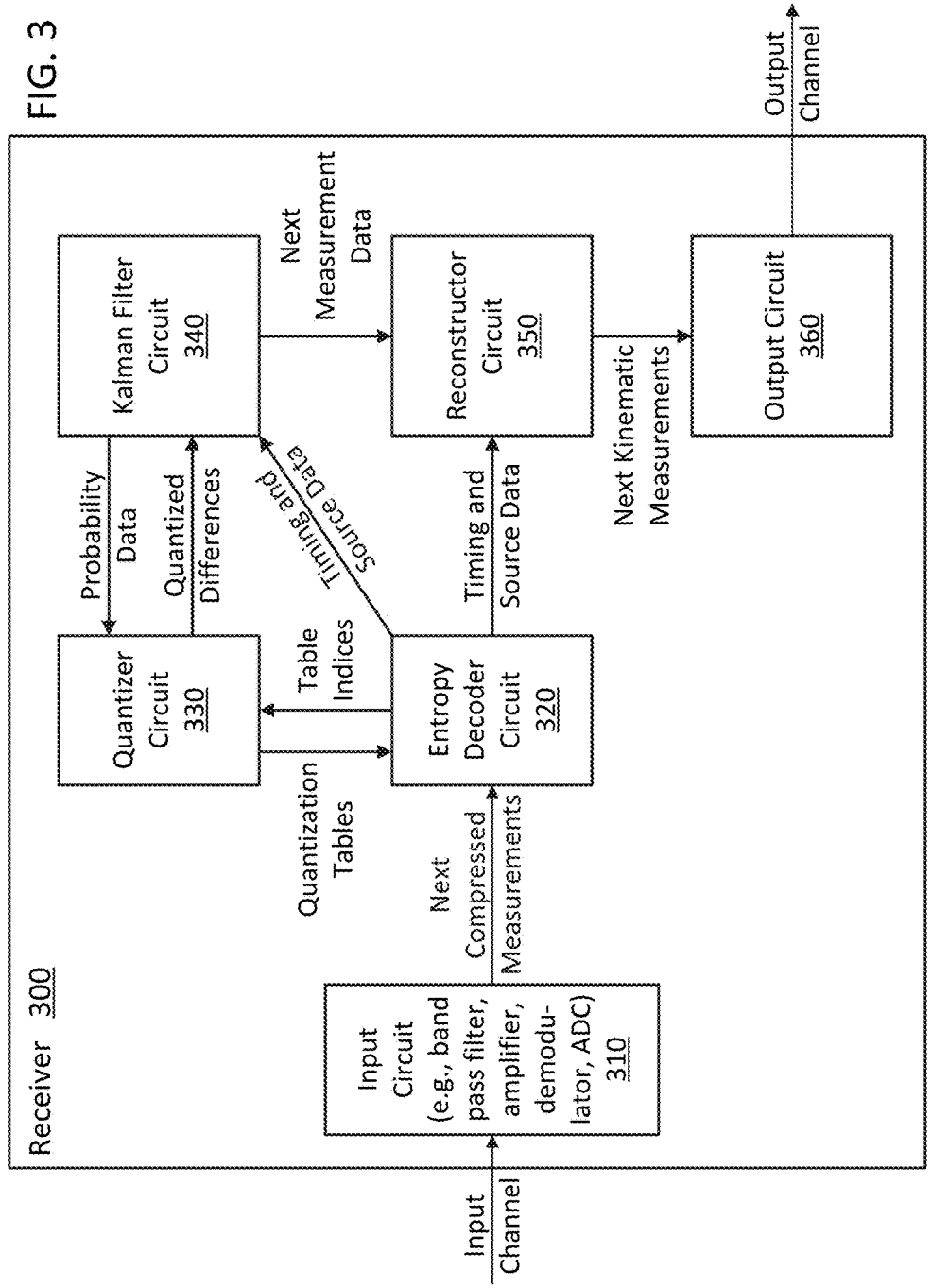
FIG. 3 is a block diagram of an example receiver for receiving and decompressing the kinematic data transmitted by the transmitter of FIG. 2, according to an embodiment of the present disclosure.

FIG. 3 is a block diagram of an example receiver 300 for receiving and decompressing the kinematic data transmitted by the transmitter 200 of FIG. 2, according to an embodiment of the present disclosure. The receiver 300 of FIG. 3 uses many similar (and often similarly named) components and techniques as the transmitter 200 of FIG. 2. Accordingly, most of the description will focus on the differences between their components and techniques, and description of common components and techniques may not be repeated. For ease of description, the input (compressed measurements) to the receiver 300 will be assumed to be in the same format as the output compressed measurements of the transmitter 200.

In FIG. 3, the next compressed measurements are input to the receiver 300 at the input circuit 310 through an input channel (e.g., a wired or wireless data link, such as from the transmitter 200). For example, the input channel of the receiver 300 can be the output channel of the transmitter 200. In some embodiments, the input circuit 310 is a radio receiving circuit including, e.g., a bandpass filter to filter out any non-carrier wave signals, an amplifier to amplify the received modulated carrier wave, and a demodulator to demodulate the modulated carrier wave to extract the next compressed measurements. For example, in some such embodiments, an analog to digital converter (ADC) is used to perform some of the demodulation of the modulated carrier wave.

A decoder circuit 320 (such as an entropy decoder configured to decode encoded indices produced by the entropy coder circuit 260 of FIG. 2) takes the next compressed measurement or next compressed measurement associated with a particular track, and extracts the timing and source data from the compressed measurement. A filter circuit 340 (such as a Kalman filter) similar to the filter circuit 230 of FIG. 2 uses the extracted timing and source data together with the previous kinematic state of the corresponding track (as determined earlier from working with previous compressed measurements associated to the same track) to generate predicted measurement data. The filter circuit 340 also produces probability distribution data for the differences between the next measurement data (or approximate measurement data) and the predicted measurement data and sends the probability data to a quantizer circuit 330.

As with the quantizer circuit 250 in the transmitter 200, the quantizer circuit 330 takes the probability data and generates a corresponding quantization table, which is sent to the entropy decoder circuit 320. The entropy decoder circuit 320 takes the quantization table, and generates all (or a sufficient number of) the entries of a corresponding encoding table (or otherwise decodes the encoded index in the next compressed measurement) to map the encoded index to the corresponding index in the quantization table. The quantizer circuit 330 takes the corresponding index and returns the associated quantized difference for this index (in the quantization table) to the filter circuit 340. The filter circuit 340 uses this quantized difference with the predicted measurement data to generate the next measurement data (e.g., the approximate measurement discussed earlier), which is sent to a reconstructor circuit 350. The reconstructor circuit uses the extracted timing and source data together with the next measurement data to generate the next kinematic measurement associated with this track, which is delivered to an output circuit 360 for distribution to the end user or consumer of the measurements over an output channel (or another portion of the receiver 300 or device containing the receiver).

Methodology

FIG. 4 is a flow diagram of an example method 400 of transmitting kinematic data, according to an embodiment of the present disclosure. The method 400 may be performed, for example, by the transmitter 200 of FIG. 2. More generally, the method 400 and other methods described herein may be implemented in hardware or combinations of hardware and software. For example, the method 400 may be implemented by the components of FIGS. 1-3. In another embodiment, the method 400 may be implemented be a custom circuit such as a multi-sensor data fuser with custom processing circuits (such as an FPGA) configured to carry out the method 400. In other embodiments, the method 400 may be performed in conjunction with a special purpose processor, such as a signal processor.

In some other embodiments, some or all of the method 400 may be implemented as a series of computer instructions, such as software, firmware, or a combination of the two, together with one or more computer processors (e.g., one or more microprocessors). The instructions, when executed on a given processor, cause portions of the method 400 to be performed. For example, in one or more embodiments, a computer program product is provided. The computer program product includes one or more non-transitory machine-readable mediums (such as a compact disc, a DVD, a solid-state drive, a hard drive, RAM, ROM, on-chip processor cache, or the like) encoded with instructions that when executed by one or more processors cause portions of the method 400 (or other method described herein) to be carried out for kinematic data packing or unpacking. In addition, while the methods described herein may appear to have a certain order to their operations, other embodiments may not be so limited. Accordingly, the order of the operations can be varied between embodiments, as would be apparent in light of this disclosure.

Referring to the method 400 of FIG. 4, a transmitter (such as transmitter 200) begins with creating 410 and maintaining, by an associator (such as associator circuit 220), a set of tracks for tracking objects observed by a set of kinematic sensors. In addition, the next kinematic measurements from these sensors are associated, by the associator, to the set of tracks based on likelihood data (e.g., likelihood data generated by a filter, such as a Kalman filter like Kalman filter circuit 230, that provides an indication how likely a new kinematic measurement belongs to an existing track). The method 400 further includes generating 420, by the filter, predicted measurements for the set of tracks based on previous kinematic states of the set of tracks and on timing and source data of the next kinematic measurements as associated to the set of tracks. The method 400 further includes generating 430, by the filter, difference data and probability data of the differences between the predicted measurements and the measurement data of the next kinematic measurements.

The method 400 further includes quantizing 440, by a quantizer (such as quantizer circuit 250), the probability data into the quantization tables, and generating, by the quantizer, corresponding indices in the quantization tables based on the generated difference data. The method 400 further includes encoding 450, by a coder (such as an entropy coder like entropy coder circuit 260), the corresponding indices in the quantization tables into encoded index data using the quantized probability data, and generating, by the coder, next compressed measurements from the encoded index data and the timing and source data of the next kinematic measurements as associated to the set of tracks. The method 400 further includes adjusting 460, by the filter, the measurement data of the next kinematic measurements to conform the difference data to the quantized differences, and generating, by the filter, the next kinematic states of the set of tracks based on the previous kinematic states and the next kinematic measurements as associated to the set of tracks.

FIG. 5 is a flow diagram of an example method 500 of receiving kinematic data transmitted using the method 400 of FIG. 4, according to an embodiment of the present disclosure. Referring to the method 500 of FIG. 5, a receiver (such as receiver 300) begins with generating 510, by a filter (such as a Kalman filter, e.g., Kalman filter circuit 340), predicted measurements for a set of tracks based on previous kinematic states of the set of tracks and on timing and source data of next compressed measurements associated to the set of tracks. The method 500 further includes generating 520, by the filter, probability data of differences between the predicted measurements and measurement data of next kinematic measurements. The method 500 further includes quantizing 530, by a quantizer (such as quantizer circuit 330), the probability data into quantization tables.

The method 500 further includes decoding 540, by a decoder (such as an entropy decoder like entropy decoder circuit 320), encoded index data of the next compressed measurements into corresponding indices in the quantization tables using the quantized probability data. The method 500 further includes looking up 550, by the quantizer, quantized differences between the predicted measurements and the measurement data from the corresponding indices in the quantization tables. The method 500 further includes generating 560, by the filter, the measurement data of the next kinematic measurements using the predicted measurements and the quantized differences. The method 500 further includes reconstructing 570, by a reconstructor (such as reconstructor circuit 350), the next kinematic measurements, and generating, by the filter, next kinematic states of the set of tracks based on the previous kinematic states, the timing and source data of the next compressed measurements, and the generated measurement data.

Further Example Embodiments

The following examples pertain to further embodiments, from which numerous permutations and configurations will be apparent.

Example 1 is a receiver including: a filter circuit to generate predicted measurements for a set of tracks based on previous kinematic states of the set of tracks and on timing and source data of next compressed measurements associated to the set of tracks, generate probability data of differences between the predicted measurements and measurement data of next kinematic measurements, generate the measurement data of the next kinematic measurements using the predicted measurements and quantized differences between the predicted measurements and the measurement data, and generate next kinematic states of the set of tracks based on the previous kinematic states, the timing and source data of the next compressed measurements, and the generated measurement data; a quantizer circuit to quantize the probability data into quantization tables and look up the quantized differences from corresponding indices in the quantization tables; and a decoder circuit to decode encoded index data of the next compressed measurements into the corresponding indices in the quantization tables using the quantized probability data.

Example 2 includes the receiver of Example 1, where the decoder circuit is further configured to extract the timing and source data from the next compressed measurements, the receiver further including a reconstructor circuit to reconstruct the next kinematic measurements from the generated measurement data and the extracted timing and source data.

Example 3 includes the receiver of Example 2, further including: an input circuit to receive the next compressed measurements over a first channel; and an output circuit to output the reconstructed next kinematic measurements over a second channel.

Example 4 includes the receiver of Example 1, where the filter circuit includes a Kalman filter, and the decoder circuit includes an entropy decoder.

Example 5 includes the receiver of Example 1, where the next kinematic measurements are from one or more of two-dimensional (2-D) sensors and three-dimensional (3-D) sensors, and the set of tracks are of moving objects being sensed over time by the 2-D and 3-D sensors.

Example 6 is a communication system including the receiver of Example 1, where the filter circuit is a first filter circuit, the quantizer circuit is a first quantizer circuit, the communication system further including a transmitter including: a second filter circuit to generate the predicted measurements for the set of tracks based on the previous kinematic states of the set of tracks and on timing and source data of the next kinematic measurements as associated to the set of tracks, generate the probability data of the differences between the predicted measurements and the measurement data of the next kinematic measurements, generate difference data between the predicted measurements and the measurement data of the next kinematic measurements, and generate the next kinematic states of the set of tracks based on the previous kinematic states and the next kinematic measurements as associated to the set of tracks; a second quantizer circuit to quantize the probability data into the quantization tables and generate the corresponding indices in the quantization tables based on the difference data; and an encoder circuit to encode the corresponding indices in the quantization tables into the encoded index data using the quantized probability data, and generate the next compressed measurements from the encoded index data and the timing and source data of the next kinematic measurements as associated to the set of tracks.

Example 7 includes the communication system of Example 6, further including an input circuit to receive the next compressed measurements over a channel, the transmitter further including: an associator circuit to create and maintain the set of tracks, and associate the next kinematic measurements to the set of tracks based on likelihood data generated by the second filter circuit; a side information circuit to extract the timing and source data from the next kinematic measurements; and an output circuit to output the next compressed measurements over the channel, where the second quantizer circuit is further to generate the quantized differences from the difference data, the second filter circuit is further to adjust the measurement data of the next kinematic measurements to conform the difference data to the quantized differences, and the encoder circuit is further to generate the next compressed measurements from the extracted timing and source data.

Example 8 is a method of receiving kinematic data, the method including: generating, by an electronic processor, predicted measurements for a set of tracks based on previous kinematic states of the set of tracks and on timing and source data of next compressed measurements associated to the set of tracks; generating, by the processor, probability data of differences between the predicted measurements and measurement data of next kinematic measurements; quantizing, by the processor, the probability data into quantization tables; decoding, by the processor, encoded index data of the next compressed measurements into corresponding indices in the quantization tables using the quantized probability data; looking up, by the processor, quantized differences between the predicted measurements and the measurement data from the corresponding indices in the quantization tables; generating, by the processor, the measurement data of the next kinematic measurements using the predicted measurements and the quantized differences; and generating, by the processor, next kinematic states of the set of tracks based on the previous kinematic states, the timing and source data of the next compressed measurements, and the generated measurement data.

Example 9 includes the method of Example 8, further including: receiving the next compressed measurements over a first channel; extracting, by the processor, the timing and source data from the next compressed measurements; reconstructing, by the processor, the next kinematic measurements from the generated measurement data and the extracted timing and source data; and outputting the reconstructed next kinematic measurements over a second channel.

Example 10 includes the method of Example 8, where the generating of the predicted measurements, the probability data, the measurement data, and the next kinematic states uses a Kalman filter, and the decoding uses an entropy decoder.

Example 11 includes the method of Example 8, where the next kinematic measurements are from one or more of two-dimensional (2-D) sensors and three-dimensional (3-D) sensors, and the set of tracks are of moving objects being sensed over time by the 2-D and 3-D sensors.

Example 12 is a method of transmitting and receiving kinematic data using the method of Example 8, the electronic processor being a first processor, the method further including: generating, by a second processor, the predicted measurements for the set of tracks based on the previous kinematic states of the set of tracks and on timing and source data of the next kinematic measurements as associated to the set of tracks; generating, by the second processor, the probability data of the differences between the predicted measurements and the measurement data of the next kinematic measurements; quantizing, by the second processor, the probability data into the quantization tables; generating, by the second processor, difference data between the predicted measurements and the measurement data of the next kinematic measurements; generating, by the second processor, the corresponding indices in the quantization tables based on the difference data; encoding, by the second processor, the corresponding indices in the quantization tables into the encoded index data using the quantized probability data; generating, by the second processor, the next kinematic states of the set of tracks based on the previous kinematic states and the next kinematic measurements as associated to the set of tracks; and generating, by the second processor, the next compressed measurements from the encoded index data and the timing and source data of the next kinematic measurements as associated to the set of tracks.

Example 13 includes the method of Example 12, further including: creating and maintaining, by the second processor, the set of tracks; generating, by the second processor, likelihood data relating the next kinematic measurements to the set of tracks; associating, by the second processor, the next kinematic measurements to the set of tracks based on the likelihood data; extracting, by the second processor, the timing and source data from the next kinematic measurements; generating, by the second processor, the quantized differences from the difference data; adjusting, by the second processor, the measurement data of the next kinematic measurements to conform the difference data to the quantized differences; generating, by the second processor, the next compressed measurements from the extracted timing and source data; outputting, by the second processor, the next compressed measurements over a channel; and receiving, over the channel, the next compressed measurements.

Example 14 is a transmitter (such as a communications transmitter) including: a filter circuit to generate predicted measurements for a set of tracks based on previous kinematic states of the set of tracks and on timing and source data of next kinematic measurements as associated to the set of tracks, generate probability data of differences between the predicted measurements and measurement data of the next kinematic measurements, generate difference data between the predicted measurements and the measurement data of the next kinematic measurements, and generate next kinematic states of the set of tracks based on the previous kinematic states and the next kinematic measurements as associated to the set of tracks; a quantizer circuit to quantize the probability data into quantization tables and generate corresponding indices in the quantization tables based on the difference data; and an encoder circuit to encode the indices in the quantization tables into encoded index data using the quantized probability data, and generate next compressed measurements from the encoded index data and the timing and source data of the next kinematic measurements as associated to the set of tracks.

Example 15 includes the transmitter of Example 14, where the filter circuit is further configured to generate likelihood data relating the next kinematic measurements to the set of tracks, the transmitter further including an associator circuit to create and maintain the set of tracks, and associate the next kinematic measurements to the set of tracks based on the generated likelihood data.

Example 16 includes the transmitter of Example 14, where the quantizer circuit is further to generate quantized differences from the difference data, and the filter circuit is further to adjust the measurement data of the next kinematic measurements to conform the difference data to the quantized differences.

Example 17 includes the transmitter of Example 14, further including a side information circuit to extract the timing and source data from the next kinematic measurements, and the encoder circuit further generates the next compressed measurements from the extracted timing and source data.

Example 18 includes the transmitter of Example 14, further including: an input circuit to receive the next kinematic measurements over a first channel; and an output circuit to output the next compressed measurements over a second channel.

Example 19 includes the transmitter of Example 14, where the filter circuit includes a Kalman filter, and the encoder circuit includes an entropy coder.

Example 20 includes the transmitter of Example 14, where the next kinematic measurements are from one or more of two-dimensional (2-D) sensors and three-dimensional (3-D) sensors, and the set of tracks are of moving objects being sensed over time by the 2-D and 3-D sensors.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. In addition, various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A receiver comprising:
   a filter circuit to:
      generate predicted measurements for a set of tracks based on previous kinematic states of the set of tracks and on timing and source data of next compressed measurements associated to the set of tracks;
      generate probability data of differences between the predicted measurements and measurement data of next kinematic measurements;
      generate the measurement data of the next kinematic measurements using the predicted measurements and quantized differences between the predicted measurements and the measurement data; and
      generate next kinematic states of the set of tracks based on the previous kinematic states, the timing and source data of the next compressed measurements, and the generated measurement data;
   a quantizer circuit to quantize the probability data into quantization tables and look up the quantized differences from corresponding indices in the quantization tables; and
   a decoder circuit to decode encoded index data of the next compressed measurements into the corresponding indices in the quantization tables using the quantized probability data.

2. The receiver of claim 1, wherein the decoder circuit is further configured to extract the timing and source data from the next compressed measurements, the receiver further comprising a reconstructor circuit to reconstruct the next kinematic measurements from the generated measurement data and the extracted timing and source data.

3. The receiver of claim 2, further comprising:
an input circuit to receive the next compressed measurements over a first channel; and
an output circuit to output the reconstructed next kinematic measurements over a second channel.

4. The receiver of claim 1, wherein the filter circuit comprises a Kalman filter, and the decoder circuit comprises an entropy decoder.

5. The receiver of claim 1, wherein the next kinematic measurements are from one or more of two-dimensional (2-D) sensors and three-dimensional (3-D) sensors, and the set of tracks are of moving objects being sensed over time by the 2-D and 3-D sensors.

6. A communication system comprising the receiver of claim 1, wherein the filter circuit is a first filter circuit, the quantizer circuit is a first quantizer circuit, the communication system further comprising a transmitter including:
a second filter circuit to
generate the predicted measurements for the set of tracks based on the previous kinematic states of the set of tracks and on timing and source data of the next kinematic measurements as associated to the set of tracks,
generate the probability data of the differences between the predicted measurements and the measurement data of the next kinematic measurements,
generate difference data between the predicted measurements and the measurement data of the next kinematic measurements, and
generate the next kinematic states of the set of tracks based on the previous kinematic states and the next kinematic measurements as associated to the set of tracks;
a second quantizer circuit to quantize the probability data into the quantization tables and generate the corresponding indices in the quantization tables based on the difference data; and
an encoder circuit to encode the corresponding indices in the quantization tables into the encoded index data using the quantized probability data, and generate the next compressed measurements from the encoded index data and the timing and source data of the next kinematic measurements as associated to the set of tracks.

7. The communication system of claim 6, further comprising an input circuit to receive the next compressed measurements over a channel, the transmitter further comprising:
an associator circuit to create and maintain the set of tracks, and associate the next kinematic measurements to the set of tracks based on likelihood data generated by the second filter circuit;
a side information circuit to extract the timing and source data from the next kinematic measurements; and
an output circuit to output the next compressed measurements over the channel, wherein
the second quantizer circuit is further to generate the quantized differences from the difference data,
the second filter circuit is further to adjust the measurement data of the next kinematic measurements to conform the difference data to the quantized differences, and
the encoder circuit is further to generate the next compressed measurements from the extracted timing and source data.

8. A method of receiving kinematic data, the method comprising:
generating, by an electronic processor, predicted measurements for a set of tracks based on previous kinematic states of the set of tracks and on timing and source data of next compressed measurements associated to the set of tracks;
generating, by the processor, probability data of differences between the predicted measurements and measurement data of next kinematic measurements;
quantizing, by the processor, the probability data into quantization tables;
decoding, by the processor, encoded index data of the next compressed measurements into corresponding indices in the quantization tables using the quantized probability data;
looking up, by the processor, quantized differences between the predicted measurements and the measurement data from the corresponding indices in the quantization tables;
generating, by the processor, the measurement data of the next kinematic measurements using the predicted measurements and the quantized differences; and
generating, by the processor, next kinematic states of the set of tracks based on the previous kinematic states, the timing and source data of the next compressed measurements, and the generated measurement data.

9. The method of claim 8, further comprising:
receiving the next compressed measurements over a first channel;
extracting, by the processor, the timing and source data from the next compressed measurements;
reconstructing, by the processor, the next kinematic measurements from the generated measurement data and the extracted timing and source data; and
outputting the reconstructed next kinematic measurements over a second channel.

10. The method of claim 8, wherein the generating of the predicted measurements, the probability data, the measurement data, and the next kinematic states uses a Kalman filter, and the decoding uses an entropy decoder.

11. The method of claim 8, wherein the next kinematic measurements are from one or more of two-dimensional (2-D) sensors and three-dimensional (3-D) sensors, and the set of tracks are of moving objects being sensed over time by the 2-D and 3-D sensors.

12. A method of transmitting and receiving kinematic data using the method of claim 8, the electronic processor being a first processor, the method further comprising:
generating, by a second processor, the predicted measurements for the set of tracks based on the previous kinematic states of the set of tracks and on timing and source data of the next kinematic measurements as associated to the set of tracks;
generating, by the second processor, the probability data of the differences between the predicted measurements and the measurement data of the next kinematic measurements;
quantizing, by the second processor, the probability data into the quantization tables;
generating, by the second processor, difference data between the predicted measurements and the measurement data of the next kinematic measurements;
generating, by the second processor, the corresponding indices in the quantization tables based on the difference data;

encoding, by the second processor, the corresponding indices in the quantization tables into the encoded index data using the quantized probability data;

generating, by the second processor, the next kinematic states of the set of tracks based on the previous kinematic states and the next kinematic measurements as associated to the set of tracks; and generating, by the second processor, the next compressed measurements from the encoded index data and the timing and source data of the next kinematic measurements as associated to the set of tracks.

13. The method of claim 12, further comprising:

creating and maintaining, by the second processor, the set of tracks;

generating, by the second processor, likelihood data relating the next kinematic measurements to the set of tracks;

associating, by the second processor, the next kinematic measurements to the set of tracks based on the likelihood data;

extracting, by the second processor, the timing and source data from the next kinematic measurements;

generating, by the second processor, the quantized differences from the difference data;

adjusting, by the second processor, the measurement data of the next kinematic measurements to conform the difference data to the quantized differences;

generating, by the second processor, the next compressed measurements from the extracted timing and source data;

outputting, by the second processor, the next compressed measurements over a channel; and receiving, over the channel, the next compressed measurements.

14. A communications transmitter comprising:

a filter circuit to generate predicted measurements for a set of tracks based on previous kinematic states of the set of tracks and on timing and source data of next kinematic measurements as associated to the set of tracks, generate probability data of differences between the predicted measurements and measurement data of the next kinematic measurements, generate difference data between the predicted measurements and the measurement data of the next kinematic measurements, and generate next kinematic states of the set of tracks based on the previous kinematic states and the next kinematic measurements as associated to the set of tracks;

a quantizer circuit to quantize the probability data into quantization tables and generate corresponding indices in the quantization tables based on the difference data; and an encoder circuit to encode the indices in the quantization tables into encoded index data using the quantized probability data, and generate next compressed measurements from the encoded index data and the timing and source data of the next kinematic measurements as associated to the set of tracks.

15. The communications transmitter of claim 14, wherein the filter circuit is further configured to generate likelihood data relating the next kinematic measurements to the set of tracks, the communications transmitter further comprising an associator circuit to create and maintain the set of tracks, and associate the next kinematic measurements to the set of tracks based on the generated likelihood data.

16. The communications transmitter of claim 14, wherein the quantizer circuit is further to generate quantized differences from the difference data, and the filter circuit is further to adjust the measurement data of the next kinematic measurements to conform the difference data to the quantized differences.

17. The communications transmitter of claim 14, further comprising a side information circuit to extract the timing and source data from the next kinematic measurements, and the encoder circuit further generates the next compressed measurements from the extracted timing and source data.

18. The communications transmitter of claim 14, further comprising:

an input circuit to receive the next kinematic measurements over a first channel; and an output circuit to output the next compressed measurements over a second channel.

19. The communications transmitter of claim 14, wherein the filter circuit comprises a Kalman filter, and the encoder circuit comprises an entropy coder.

20. The communications transmitter of claim 14, wherein the next kinematic measurements are from one or more of two-dimensional (2-D) sensors and three-dimensional (3-D) sensors, and the set of tracks are of moving objects being sensed over time by the 2-D and 3-D sensors.

* * * * *